(12) United States Patent
Inagaki et al.

(10) Patent No.: US 6,590,516 B2
(45) Date of Patent: Jul. 8, 2003

(54) CURRENT STEERING TYPE D/A CONVERTER

(75) Inventors: Yoshitsugu Inagaki, Osaka (JP); Heiji Ikoma, Ikoma-gun (JP)

(73) Assignee: Matsushita Electric Industrial Co., Ltd. (JP)

( * ) Notice: Subject to any disclaimer, the term of this patent is extended or adjusted under 35 U.S.C. 154(b) by 0 days.

(21) Appl. No.: 10/156,762

(22) Filed: May 29, 2002

(65) Prior Publication Data

US 2002/0186156 A1 Dec. 12, 2002

(30) Foreign Application Priority Data

May 30, 2001 (JP) ........................................ 2001-162733

(51) Int. Cl.[7] .............................................. H03M 1/66
(52) U.S. Cl. ...................................... 341/144; 341/143
(58) Field of Search ................................. 341/144, 143, 341/145, 118, 120

(56) References Cited

U.S. PATENT DOCUMENTS 5,635,935 A    6/1997  Ignowski et al. ............ 341/135
5,815,046 A  * 9/1998  Spilker, Jr. et al. ......... 332/103
6,067,327 A  * 5/2000  Creigh et al. ................ 375/295

FOREIGN PATENT DOCUMENTS

JP     3-105037     10/1991
JP     5-206860     8/1993

* cited by examiner

Primary Examiner—Peguy JeanPierre
Assistant Examiner—Joseph J Lauture
(74) Attorney, Agent, or Firm—Parkhurst & Wendel, L.L.P.

(57) ABSTRACT

A current steering type D/A converter comprises a D/A conversion circuit having plural current sources each outputting a predetermined current, and a logic circuit for selecting desired current sources from among the plural current sources; a reference voltage generation circuit for generating a reference voltage potential that determines an output current value of the D/A conversion circuit; and a control circuit for setting the D/A conversion circuit in the ON state or OFF state by controlling switch elements which are placed between the D/A conversion circuit and the reference voltage generation circuit. Therefore, current consumption of the current steering type D/A converter can be reduced.

6 Claims, 6 Drawing Sheets

CURRENT STEERING TYPE D/A CONVERTER

FIELD OF THE INVENTION

The present invention relates to a current steering type D/A (digital-to-analog) converter to be used in a semiconductor integrated circuit and, more particularly, to an improved current steering type D/A converter containing plural circuit blocks.

BACKGROUND OF THE INVENTION

As an LSI grows in performance, there is an increasing need for a current steering type D/A converter mounted on the LSI chip to change its operation mode according to the use of the LSI, for example, to operate internal D/A conversion circuits in their normal states or power down states according to the use mode of the LSI.

FIG. 5 is a block diagram illustrating a conventional current steering type D/A converter 500.

With reference to FIG. 5, the current steering type D/A converter 500 comprises a D/A conversion circuit 510, a reference voltage generation circuit 520, and a power down control circuit 530. The D/A conversion circuit 510 comprises plural current sources 5101 each outputting a predetermined current, and a logic circuit 5102 for selecting required current sources corresponding to a digital input code, from among the plural current sources 5101. The reference voltage generation circuit 520 outputs a reference voltage VB, and this reference voltage VB determines a current value IOUT to be outputted from a current output terminal DAOUT of the D/A conversion circuit 510. A P channel MOS transistor constituting the power down control circuit 530 performs a switching operation for switching the current steering type D/A converter 500 between its normal state and power down state, according to a power down control signal supplied from a power down control terminal NPD.

Hereinafter, the operation of the current steering type D/A converter 500 constituted as described above will be described for its normal state and power down state.

First of all, when a "Low" signal (hereinafter referred to as a "L" signal) is inputted as a power down control signal to the power down control terminal NPD, the current steering type D/A converter 500 goes into the power down state. That is, the "L" signal inputted as the power down control signal brings the power down control circuit 530 into conduction, and a potential at a fixed potential node 560 is applied to a wiring 550 which connects a reference voltage VB node of the D/A conversion circuit 510 and a reference voltage node of the reference voltage generation circuit 520. The fixed potential node 560 has previously been set at a potential that halts the current sources 5101 of the D/A conversion circuit 510 and the reference voltage generation circuit 520. When this potential is applied to the D/A conversion circuit 510 and the reference voltage generation circuit 520, the current sources 5101 of the D/A conversion circuit 510 and the reference voltage generation circuit 520 halt the operations.

Next, when a "High" signal (hereinafter referred to as a "H" signal) is inputted as a power down control signal to the power down control terminal NPD, the current steering type D/A converter 500 operates in the normal state. That is, the "H" signal inputted as the power down control signal brings the power down control circuit 530 into the non-conducting state, and the potential of the fixed potential node 560 is not applied to the wiring 550. The reference voltage generation circuit 520 contains a power on control circuit (not shown) and a fixed potential node (not shown) corresponding to the power down control circuit 530 and the fixed potential node 560, respectively, and the fixed potential node (not shown) is set at a voltage that operates the reference voltage generation circuit 520. When the power on control circuit (not shown) receives the "H" signal, it transfers the voltage of the fixed potential node (not shown) to the main unit of the reference voltage generation circuit 520. On receipt of the "H" signal as the power down control signal, the reference voltage generation circuit 520 outputs a reference voltage VB, and this voltage is supplied to the current sources 5101 of the D/A conversion circuit 510. Subsequently, the logic circuit 5102 selects current sources corresponding to a digital input code, from among the plural current sources 5101, and a current IOUT that is the sum of the currents of the selected current sources is outputted from the current output terminal DAOUT.

As described above, in the case where the single D/A conversion circuit 510 is provided corresponding to the single reference voltage generation circuit 520, the MOS transistor 530 functioning as the power down control circuit switches the supply of power to the D/A conversion circuit 510 so that the D/A conversion circuit 510 goes into the normal state or the power down state.

Next, a description will be given of a conventional current steering type D/A converter in which plural D/A conversion circuits are provided corresponding to a single reference voltage generation circuit.

FIG. 6 is a block diagram illustrating a conventional current steering type D/A converter 600 having plural D/A conversion circuits. In FIG. 6, only two D/A conversion circuits are shown for the sake of simplicity.

With reference to FIG. 6, the current steering type D/A converter 600 comprises a first D/A conversion circuit 611, a second D/A conversion circuit 612, a reference voltage generation circuit 620, and a power down control circuit 630.

The first D/A conversion circuit 611 comprises plural current sources 6111 each outputting a predetermined current, and a first logic circuit 6112 for selecting required current sources corresponding to a digital input code, from among the plural current sources 6111. The second D/A conversion circuit 612 comprises plural current sources 6121 each outputting a predetermined current, and a second logic circuit 6122 for selecting required current sources corresponding to a digital input code, from among the plural current sources 6121. The reference voltage generation circuit 620 outputs a reference voltage VB, and the reference voltage VB determines a first current value IOUT1 to be outputted from a first current output terminal DAOUT1 of the first D/A conversion circuit 611, as well as a second current value IOUT2 to be outputted from a second current output terminal DAOUT2 of the second D/A conversion circuit 612. A P channel MOS transistor constituting the power down control circuit 630 performs a switching operation for switching the current steering type D/A converter 600 between its normal state and power down state, according to a power down control signal supplied from a power down control terminal NPD.

Hereinafter, the operation of the current steering type D/A converter 600 constituted as described above will be described for its normal state and power down state.

First of all, when a "L" signal is inputted to the power down control terminal NPD as a power down control signal, the current steering type D/A converter 600 operates in the power down state. That is, the "L" signal inputted as the power down control signal brings the power down control circuit 630 into conduction, and a potential of a fixed potential node 660 is supplied to a wiring 650 which connects the reference voltage VB nodes of the D/A conversion circuits 611 and 612 and the reference voltage VB node of the reference voltage generation circuit 620. The fixed potential node 660 has previously been set at a potential that halts the current sources 6111 and 6121 of the D/A conversion circuits 611 and 612 and the reference voltage generation circuit 620. When this potential is applied to the first and second D/A conversion circuits 611 and 612 and the reference voltage generation circuit 620, the respective current sources 6111 and 6121 of the D/A conversion circuits 611 and 612 and the reference voltage generation circuit 620 halt the operations.

On the other hand, when a "H" signal is inputted to the power down control terminal NPD as a power down control signal, the current steering type D/A converter 600 operates in the normal state. That is, the "H" signal inputted as the power down control signal brings the power down controller 630 into the non-conducting state, and the potential of the fixed potential node 660 is not supplied to the wiring 650. The reference voltage generation circuit 620 contains a power on control circuit (not shown) and a fixed potential node (not shown) which correspond to the power down control circuit 630 and the fixed potential node 660, respectively, and the fixed potential node (not shown) is set to a potential that operates the reference voltage generation circuit 620. When the power on control circuit (not shown) receives the "H" signal, it operates the reference voltage generation circuit 620 with the potential of the fixed potential node (not shown). The reference voltage generation circuit 620 outputs a reference voltage VB, and this voltage is supplied to the plural current sources 6111 and 6121 of the D/A conversion circuits 611 and 612. Subsequently, the first logic circuit 6112 selects current sources corresponding to a digital input code from among the plural current sources 6111, and a current IOUT1 that is the sum of the currents of the selected current sources is outputted from the first current output terminal DAOUT1. Likewise, the second logic circuit 6122 selects current sources corresponding to a digital input code from among the plural current sources 6121, and a current IOUT2 that is the sum of the currents of the selected current sources is outputted from the second current output terminal DAOUT2.

As described above, in the case where the plural D/A conversion circuits 611 and 612 are provided corresponding to the single reference voltage generation circuit 620, the MOS transistor 630 functioning as the power down control circuit switches the supply of power to the D/A conversion circuit 611 (612) so that the D/A conversion circuit 611 (612) goes into the normal state or the power down state.

To be specific, in the conventional current steering type D/A converter, the operation of the whole circuit is switched between the normal state and the power down state by inputting the "H" or "L" signal as the power down control signal to the power down control terminal NPD.

In the conventional current steering type D/A converter, however, when it is in the power down state, the reference voltage to be supplied to all of the D/A conversion circuits is fixed at a potential that halts the current sources of the D/A conversion circuits, whereby the flows of current in the respective D/A conversion circuits are stopped at the same time. Therefore, the respective D/A conversion circuits cannot be power-down-controlled individually.

That is, in the case where the conventional current steering type D/A converter 600 is provided with the plural D/A conversion circuits 611 and 612 corresponding to the single reference voltage generation circuit 620 as shown in FIG. 6, when a "H" signal is inputted to the power down control circuit 630 as the power down control signal, all of the reference voltage generation circuit 620 and the D/A conversion circuits 611 and 612 go into the conducting states at the same time. On the other hand, when a "L" signal is inputted to the power down control circuit 630 as the power control signal, all of the reference voltage generation circuit 620 and the D/A conversion circuits 611 and 612 go into the non-conducting states at the same time.

Accordingly, when the conventional current steering type D/A converter is provided with plural D/A conversion circuits, the reference voltage generation circuit 620 cannot set a specific D/A conversion circuit into its conducting state while setting the other D/A conversion circuit into its non-conducting states, that is, the reference voltage generation circuit 620 cannot set the respective D/A conversion circuits into the power down states individually.

SUMMARY OF THE INVENTION

The present invention is made to solve the above-described problems and has for its object to provide a current steering type D/A converter which can perform power down control for plural D/A conversion circuits individually.

Other objects and advantages of the invention will become apparent from the detailed description that follows. The detailed description and specific embodiments described are provided only for illustration since various additions and modifications within the scope of the invention will be apparent to those of skill in the art from the detailed description.

According to a first aspect of the present invention, there is provided a current steering type D/A converter comprising: a D/A conversion circuit for performing D/A conversion, comprising plural current sources each outputting a predetermined current, and a logic circuit for selecting desired current sources from among the plural current sources; a reference voltage generation circuit for generating a reference voltage potential which determines an output current value of the D/A conversion circuit; a first switch element having an end being connected to a reference voltage output terminal of the reference voltage generation circuit, and the other end being connected to a reference voltage input terminal of the D/A conversion circuit; a second switch element having an end being connected to a fixed potential for fixing the reference voltage potential at a predetermined potential that prevents current from flowing in the D/A conversion circuit, and the other end being connected to a node which connects the end of the first switch element and the reference voltage output terminal of the reference voltage generation circuit; and a control circuit for controlling the switch elements so as to set the first switch element into the ON state, and the second and third switch elements into the OFF states, when the D/A conversion circuit is to be operated in the normal state, and controlling the switch elements so as to set the first switch element into the OFF state, and the second and third switch elements into the ON states, when the D/A conversion circuit is to be operated in the power down state. Therefore, the D/A conversion circuit and the reference voltage generation circuit can be power-down-controlled individually, whereby current consumption of the current steering type D/A converter can be reduced.

According to a second aspect of the present invention, the current steering type D/A converter according to the first aspect comprises: n pieces of the D/A conversion circuits (n: integer equal to or larger than 2); the first switch element and the second switch element being provided for each of the n pieces of D/A conversion circuits; and, instead of the above-mentioned control circuit, a control circuit for controlling the switch elements so as to set the third switch element into the ON state, the n pieces of first switch elements into the OFF states, and the n pieces of second switch elements into the ON states, when all of the n pieces of D/A conversion circuits are to be operated in the normal states, controlling the switch elements so as to set the third switch element into the ON state, the n pieces of first switch elements into the OFF states, and the n pieces of second switch elements into the ON states, when all of the n pieces of D/A conversion circuits are to be operated in the power down states, and controlling the switch elements such that, when at least one of the n pieces of D/A conversion circuits is to be operated in the power down state while the remaining circuits are to be operated in the normal states, the third switch element is set into the OFF state, the first switch element and the second switch element of the D/A conversion circuit to be power-down-operated are set into the OFF state and the ON state, respectively, and the first switch elements and the second switch elements of the remaining circuits to be operated in the normal states are set into the ON states and the OFF states, respectively. Therefore, even when the current steering type D/A converter is provided with plural D/A conversion circuits, the respective D/A conversion circuits and the reference voltage generation circuit can be power-down-controlled individually, whereby current consumption of the current steering type D/A converter can be reduced by an amount of current to be consumed by the unused D/A conversion circuits.

According to a third aspect of the present invention, the current steering type D/A converter according to the first or second aspect further comprises a capacity element which is connected between the node connecting the reference voltage output terminal of the reference voltage generation circuit with the end of the third switch element, and the power supply potential or ground potential. Therefore, a low pass filter can be formed by the capacity element and the on-resistance components of the switch elements in the ON states, whereby noise of a high frequency component such as a sampling clock of the current steering type D/A converter is reduced, resulting in improved characteristics of the current steering type D/A converter.

DETAILED DESCRIPTION OF THE PREFERRED EMBODIMENTS

Hereinafter, preferred embodiments of the present invention will be described with reference to the drawings.

[Embodiment 1]

A first embodiment of the present invention provides a fundamental construction for realizing power down control for plural D/A conversion circuits when, a current steering type D/A converter is provided with plural D/A conversion circuits corresponding to a single reference voltage generation circuit.

Hereinafter, a current steering type D/A converter according to the first embodiment will be described with reference to FIG. 1.

Figure 1:
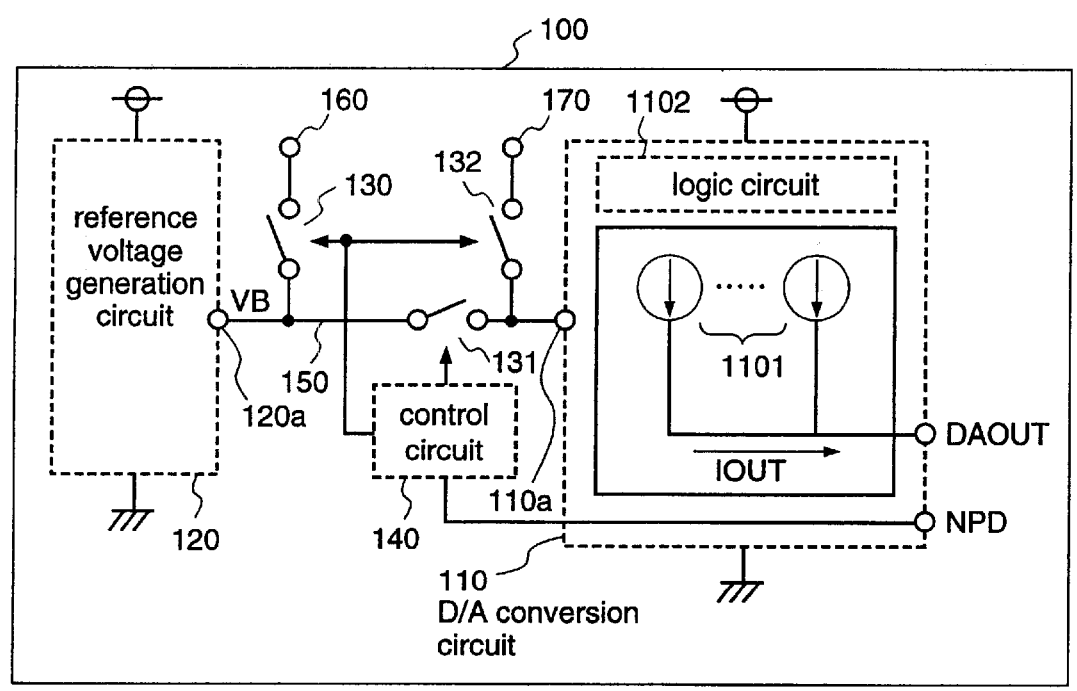
FIG. 1 is a block diagram for explaining the fundamental construction of a current steering type D/A converter according to a first embodiment of the present invention.

FIG. 1 is a block diagram illustrating a fundamental construction of a current steering type D/A converter 100 according to the first embodiment. In the fundamental construction, a single D/A conversion circuit is provided corresponding to a single reference voltage generation circuit.

With reference to FIG. 1, the current steering type D/A converter 100 comprises a D/A conversion circuit 110, a reference voltage generation circuit 120, and a control circuit 140.

The D/A conversion circuit 110 comprises plural current sources 1101 each outputting a predetermined current, and a logic circuit 1102 for selecting required current sources from among the plural current sources 1101. The reference voltage generation circuit 120 outputs a reference voltage VB, and the reference voltage VB determines a current value IOUT to be outputted from a current output terminal DAOUT. The control circuit 140 controls opening/closing of a first switch element 131, a second switch element 132, and a third switch element 130, according to a power down control signal supplied from a power down control terminal NPD.

Hereinafter, the operation of the current steering type D/A converter 100 constructed as described above will be described for its normal state and power down state, with reference to FIG. 1 and table 1.

i) Initially, when a "H" signal is inputted as a power down control signal to the power down control terminal NPD, the current steering type D/A converter 100 operates in the normal state as shown in Table 1.

ii) On the other hand, when a "L" signal is inputted as a power down control signal to the power down control terminal NPD, the current steering type D/A converter 100 operates in the power down state as shown in Table 1.

TABLE 1

|  | ii) | i) |
|---|---|---|
| power down control terminal NPD | "L" | "H" |
| current steering type D/A converter 100 (300) | power down state | normal state |
| reference voltage generation circuit 120 (320) | power down operation | normal operation |
| D/A conversion circuit 110 (310) | power down operation | normal operation |
| first switch element 131 (331) | OFF state | ON state |
| second switch element 132 (332) | ON state | OFF state |
| third switch element 130 (330) | ON state | OFF state |

Hereinafter, the operation will be described more specifically.

i) In order to set the current steering type D/A converter 100 into the normal state, a "H" signal is applied as a power down control signal to the power down control terminal NPD. At this time, the control circuit 140 sets the first switch element 131 into the conducting (ON) state, and sets the second and third switch elements 132 and 130 into the non-conducting (OFF) states. Then, the reference voltage generation circuit 120 outputs a reference voltage VB from a reference voltage output terminal 120a to the D/A conversion circuit 110 through a wiring 150 and the switch element 131, and this reference voltage VB is supplied to the current sources 1101 through a reference voltage input terminal 110a of the D/A conversion circuit 110. Subsequently, the logic circuit 1102 of the D/A conversion circuit 110 selects at least one current source corresponding to a digital input code supplied from the outside, from among the plural current sources 1101. The selected current source outputs a current IOUT according to the digital code, from the current output terminal DAOUT.

ii) On the other hand, in order to set the current steering type D/A converter 100 into the power down state, a "L" signal is applied as a power down control signal to the power down control terminal NPD. At this time, the control circuit 140 sets the first switch element 131 into the OFF state, and sets the second and third switch elements 132 and 130 into the ON states. That is, according to the power down control signal (L), the control circuit 140 turns off the first switch element 131 to prevent the reference voltage VB outputted from the reference voltage generation circuit 120 from being supplied to the D/A conversion circuit 110, and turns on the second and third switch elements 132 and 130 to supply the voltages at the fixed potential nodes 160 and 170 to the reference voltage generation circuit 120 and the D/A conversion circuit 110, respectively. Thereby, the potential is set to the predetermined fixed potential so that no current flows between the reference voltage generation circuit 120 and the D/A conversion circuit 110, and when this potential is applied to the D/A conversion circuit 110, the reference voltage generation circuit 120 and the current sources 1101 of the D/A-conversion-circuit 110 halt their operations.

Accordingly, by applying the power down control signal to the control circuit 140, the states of the reference voltage generation circuit 120 and the D/A conversion circuit 110 can be switched between the normal state and the power down state.

It is evident from the fundamental construction described above that even when the current steering type D/A converter has plural D/A conversion circuits corresponding to a single reference voltage generation circuit, the respective D/A conversion circuits can be power-down-controlled individually. This is realized by constructing the D/A converter such that a single control circuit controls the switch elements to electrically connect or isolate the reference voltage generation circuit and each of the plural D/A conversion circuits, and controls as to whether the reference voltage VB nodes of the reference voltage generation circuit and the D/A conversion circuits are to be set at the fixed potential nodes or not.

As described above, according to the first embodiment of the invention, the current steering type D/A converter 100 is provided with the control circuit 140 for controlling the switch 131 which electrically connect or isolate the reference voltage generation circuit 120 and the D/A conversion circuit 110, and controlling the switches 130 and 132 which fix the reference voltage VB nodes of the reference voltage generation circuit 120 and the D/A conversion circuit 110 to the fixed potential nodes 160 and 170, respectively. Therefore, current consumption of the current steering type D/A converter 100 can be reduced by making an instruction to the control circuit 140.

The above-described switch elements 130~132 may be implemented by MOS transistors. In this case, when a signal of a digital value "L" is inputted to the power down control terminal NPD, the gate voltage of a MOS transistor used as the first switch element 131 is fixed at a potential so that this MOS transistor is turned OFF. Likewise, when the second switch element 132 or the third switch element 130 is implemented by a MOS transistor, the gate-to-source voltage of this MOS transistor becomes a potential difference equal to or higher than the absolute value of a threshold voltage of the MOS transistor so that the MOS transistor is turned ON. In this way, since these MOS transistors pass current and are in the ON states, the reference voltage potential is fixed at the power supply voltage or the ground voltage. When employing a p-channel MOS transistor, the gate voltage is fixed at the power supply voltage. When employing an n-channel MOS transistor, the gate voltage is fixed at the ground voltage. Accordingly, also when the respective switch elements 130~132 are implemented by MOS transistors, the reference voltage generation circuit 120 and the D/A conversion circuit 110 can be power-down-controlled individually, whereby current consumption of the current steering type D/A converter 100 can be reduced.

While in this first embodiment the-fixed potential nodes 160 and 170 are set to the voltages at which the reference voltage generation circuit 120 and the D/A conversion circuit 110 halt the operations, respectively, the fixed potential nodes 160 and 170 may be set to the same voltage at which both of these circuits 120 and 110 halt the operations.

[Embodiment 2]

A second embodiment of the present invention relates to a current steering type D/A converter having plural D/A conversion circuits corresponding to a single reference voltage generation circuit, and provides a construction of the D/A converter for power-down-controlling these D/A conversion circuits individually, by using the fundamental construction described for the first embodiment.

Figure 2:
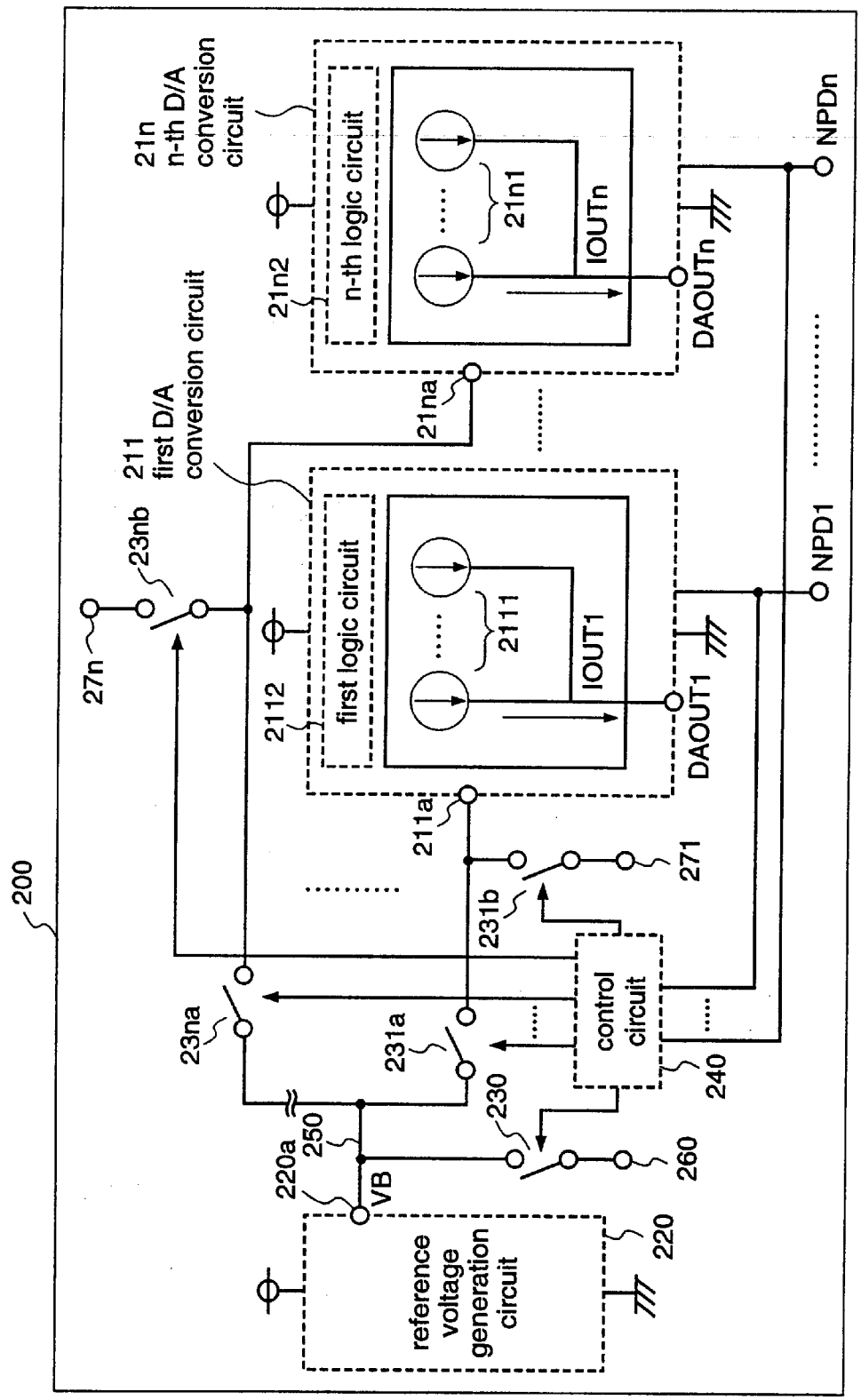
FIG. 2 is a block diagram for explaining the construction of a current steering type D/A converter according to a second embodiment of the present invention.

FIG. 2 is a block diagram for explaining the construction of a current steering type D/A converter 200 according to the second embodiment of the present invention.

With reference to FIG. 2, the current steering type D/A converter 200 is provided with first to n-th (n: integer equal to or larger than 2) D/A conversion circuits 211~21n, a reference voltage generation circuit 220, and a control circuit 240.

The first D/A conversion circuit 211 comprises plural current sources 2111 each outputting a predetermined current, and a first logic circuit 2112 for selecting required current sources from among the plural current sources 2111. Likewise, the n-th D/A-conversion circuit 21n comprises plural current sources 21n1 each outputting a predetermined current, and an n-th logic circuit 21n2 for selecting required current sources from among the plural current sources 21n1. The second to (n−1)th D/A conversion circuits have the same constructions as described above. The reference voltage generation circuit 220 outputs a reference voltage VB. This reference voltage VB determines a current value IOUT1 to be outputted from a current output terminal DAOUT1 of the first D/A conversion circuit 211, and further, it determines a current value IOUTn to be outputted from a current output terminal DAOUTn of the n-th D/A conversion circuit 21n. The same can be said of the second to (n−1)th D/A conversion circuits. The control circuit 240 controls opening/closing of a first switch element 231a for the first circuit, a second switch element 231b for the first circuit, . . . , a first switch element 23na for the n-th circuit, a second switch element 23nb for the n-th circuit, and a third switch element 230, according to first to n-th power down control signals which are supplied from first to n-th power down control terminals NPD1~NPDn.

Hereinafter, the operation of the current steering type D/A converter 200 constituted as described above will be described for its normal state, partially power down state, and completely power down state, with reference to FIG. 2 and tables 2 and 3.

TABLE 2

|  | iii) | ii) | i) |
|---|---|---|---|
| current steering type D/A converter 200 (400) | completely power down state | partially power down state | normal state |
| power down control terminals supplied with L | all | required terminals | none |
| power down control terminals supplied with H | none | remaining terminals | all |

TABLE 3

|  | iii) | ii) | i) |
|---|---|---|---|
| power down control terminals NPD1~NPDn | all at "L" | part at "L" remainder at "H" | all at "H" |
| current steering type D/A converter 200 (400) | completely power down state | partially power down state | normal state |
| reference voltage generation circuit 220 (440) | power down operation | normal operation | normal operation |
| D/A conversion circuits 211~21n (411~41n) | all in power down operation | part in power down operation remainder in normal operation | all in normal operation |
| first switch elements 231a~ 23na (431a~43na) | all in OFF state | part in OFF state remainder in ON state | all in ON state |
| second switch elements 231b~ 23nb (431b~43nb) | all in ON state | part in ON state remainder in OFF state | all in OFF state |
| third switch element 230 (430) | ON state | OFF state | OFF state | i) Initially, when "H" signals are inputted as first to n-th power down control signals to the first to n-th power down control terminals NPD1~NPDn, respectively, the current steering type D/A converter 200 operates in the normal state as shown in tables 2 and 3.

ii) On the other hand, when a "L" signal is inputted as a power down control signal to the control terminal corresponding to a required D/A conversion circuit selected from among the first to n-th power down control terminals NPD1NPDn while "H" signals are inputted as power down control signals to the control terminals corresponding to the remaining D/A conversion circuits, a part of the current steering type D/A converter 200 operates in the power down state, i.e., only the required D/A conversion circuit operates in the power down state as shown in tables 2 and 3.

iii) Furthermore, when "L" signals are inputted as the first to n-th power down control signals to the first to n-th power down control terminals NPD1~NPDn, the current steering type D/A converter 200 operates in the completely power down state, i.e., all of the D/A conversion circuits operate in the power down states as shown in tables 2 and 3.

Hereinafter, the operation will be described more specifically.

i) In order to set the current steering type D/A converter 200 into the normal state, "H" signals are inputted as the first to n-th power down control signals to the first to n-th power down control terminals NPD1~NPDn. At this time, the control circuit 240 sets the first switch element 231a for the first circuit~the first switch element 23na for the n-th circuit into the ON states, and sets the second switch element 23nb for the n-th circuit the second switch element 23nb for the n-th circuit and the third switch element 230 into the OFF states. Then, the reference voltage generation circuit 220 outputs a reference voltage VB from a reference voltage output terminal 220a through a wiring 250, and the reference voltage VB is supplied to the current sources 2111~21n1 through a reference voltage input terminal 211a of the first D/A conversion circuit 211~a reference voltage input terminal 21na of the n-th D/A conversion circuit 21n. Subsequently, the first to n-th logic circuits 2112~21n2 select current sources corresponding to digital input codes which are supplied from the outside, from among the plural current sources 2111~21n1, thereby to select required current sources. The selected current sources output currents IOUT1~IOUTn corresponding to the digital codes, from the current output terminals DAOUT1~DAOUTn.

ii) Next, in order to set the current steering type D/A converter 200 into the partially power down state, an "L" signal is inputted as the first power down control signal to at least one of the first to n-th power down control terminals NPD1~NPDn, for example, the first power down control terminal NPD1, while "H" signals are inputted as the second to n-th power down control signals to the remaining power down control terminals, for example, the second to n-th power down control terminals NPD2 (not shown)~NPDn. At this time, the control circuit 240 sets the first switch element 232a for the second circuit (not shown)~the first switch element 23na for the n-th circuit, the second switch element 231b for the first circuit, and the third switch element 230 into the ON states, and sets the first switch element 231a for the first circuit, the second switch element 232b for the second circuit (not shown)~the second switch element 23nb for the n-th circuit, and the third switch element 230 into the OFF states. Subsequently, the reference voltage generation circuit 220 outputs a reference voltage VB, and this reference voltage VB is supplied to the second to n-th D/A conversion circuits 212(not shown)~21n. Then, the second to n-th logic circuits 2122(not shown)~21n2 select current sources corresponding to digital input codes which are supplied from the outside, from among the plural current sources 2121(not shown)~21n1, thereby to select required current sources. The selected current sources output currents IOUT2(not shown)~IOUTn corresponding to the digital codes, from the current output terminals DAOUT2(not shown)~DAOUTn. On the other hand, the reference voltage VB outputted from the reference voltage generation circuit 220 is not supplied to the first D/A conversion circuit 211. That is, according to the first power down control signal (L), the control circuit 240 turns off the first switch element 231a for the first circuit to prevent the reference. voltage VB outputted from the reference voltage generation circuit 220 from being supplied to the first D/A conversion circuit 211, and turns on the second switch element 231b for the first circuit to supply the voltage at the fixed potential node 271 to the first D/A conversion circuit 211. Thereby, the potential is set at the predetermined fixed potential so that no current flows between the reference voltage generation circuit 220 and the first D/A conversion circuit 211, and when this potential is applied to the first D/A conversion circuit 211, the current sources 2111 of the first D/A conversion circuit 211 halt the operations.

iii) Next, in order to set the current steering type D/A converter 200 into the completely power down state, "L" signals are inputted as the first to n-th power down signals to the first to n-th power down control terminals NPD1~NPDn. At this time, the control circuit 240 sets the first switch element 231a for the first circuit~the first switch element 23na for the n-th circuit into the OFF states, and sets the second switch element 231b for the first circuit~the second switch element 23nb for the n-th circuit and the third switch element 230 into the ON states. That is, the reference voltage outputted from the reference voltage generation circuit 220 is not supplied to the first to n-th D/A conversion circuits 211~21n. When all of the first to n-th D/A conversion circuits 211~21n are in the power down states, the reference voltage generation circuit 220 becomes unnecessary, and therefore, the voltages at the fixed potential nodes 260 and 271~27n are supplied to the reference voltage output terminal 220a of the reference voltage generation circuit 220 and the reference voltage input terminals 211a~21na of the first to n-th D/A conversion circuits 211~21n, respectively, according to the "L" signal inputted to the control circuit 240, thereby to fix the potentials so that the current is turned off and all of these circuits halt the operations.

As described above, according to the second embodiment of the invention, the current steering type D/A converter 200 is provided with the plural D/A conversion circuits 211~21n, the switch elements. 230 and 231~23n corresponding to the respective conversion circuits, and the control circuit 240 for controlling the switch elements 230 and 231~23n to set the reference voltage generation circuit 220 and the respective D/A conversion circuits 211~21n in the ON or OFF states. Therefore, the respective D/A conversion circuits 211~21n can be power-down-controlled individually, resulting in reduced current consumption.

While in this second embodiment power-down of only one D/A conversion circuit is described as an example of partial power-down of the plural D/A conversion circuits, the number of D/A conversion circuits to be power downed is not restricted to one. That is, two or more D/A conversion circuits may be power downed, and this is achieved by inputting "L" signals as the power down control signals to the power down control terminals corresponding to the required D/A conversion circuits.

Furthermore, the-respective switch elements 230, 231a, 231b, . . . , 23na, 23nb provided for the respective D/A conversion circuits 211~21n may be implemented by MOS transistors. In this case, for example, when a signal of a digital value "L" is inputted to the first power down control terminal NPD1, the gate voltage of a MOS transistor used as the first switch element 231a of the first circuit is fixed at a potential so that this MOS transistor is turned OFF. Likewise, when the second switch element 231b for the first circuit or the third switch element 230 is implemented by a MOS transistor, the gate-to-source voltage of this MOS transistor becomes a potential difference equal to or higher than the absolute value of a threshold voltage of the MOS transistor so that the MOS transistor is turned ON. In this way, since these MOS transistors pass current and are in the ON states, the reference voltage potential is fixed at the power supply voltage or the ground voltage. When employing a p-channel MOS transistor, the gate voltage is fixed at the power supply voltage. When employing an n-channel MOS transistor, the gate voltage is fixed at the ground voltage. Accordingly, even when the respective switch elements 230~23n are implemented by MOS transistors, the reference voltage generation circuit 220 and the D/A conversion circuits 211~21n can be power-down-controlled individually, whereby current consumption of the current steering type D/A converter 200 can be reduced.

Furthermore, although the fixed potential nodes 260 and 271~27n are set to the voltages at-which the-reference voltage generation circuit 220 and the D/A conversion circuits 211~21n halt the operations, respectively, these fixed potential nodes may be set to the same voltage at which all of these circuits 220 and 211~21n halt the operations.

[Embodiment 3]

According to a third embodiment of the present invention, a capacity element is added to a current steering type D/A converter having a single D/A conversion circuit corresponding to a single reference voltage generation circuit as described for the first embodiment.

Figure 3:
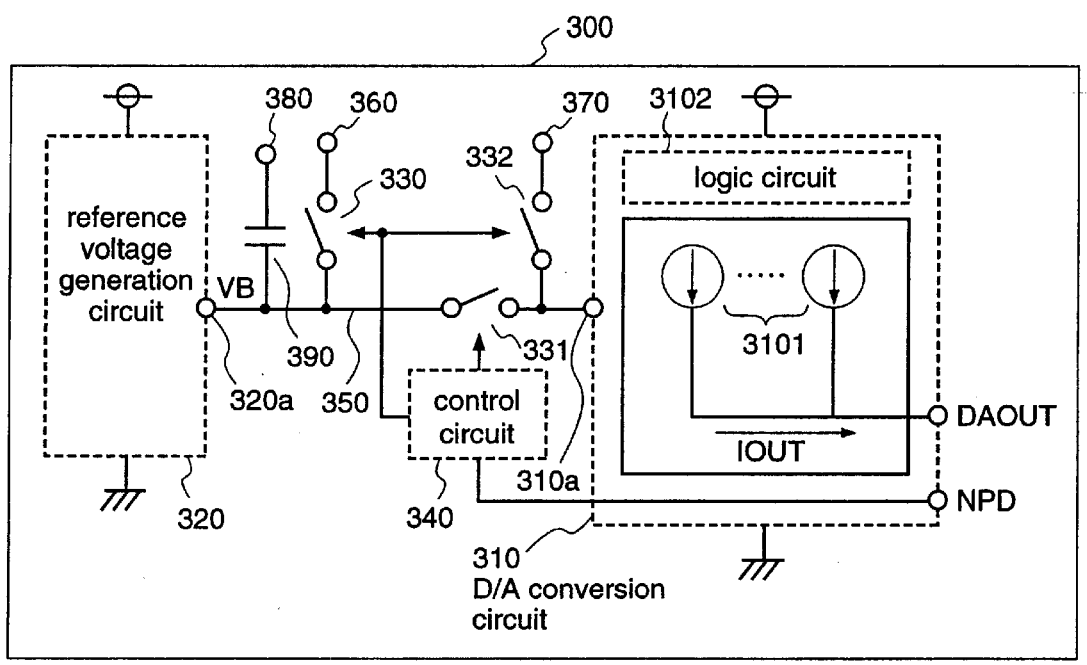
FIG. 3 is a block diagram for explaining the fundamental construction of a current steering type D/A converter according to a third embodiment of the present invention.

FIG. 3 is a block diagram for explaining the construction of a current steering type D/A converter 300 according to the third embodiment.

With reference to FIG. 3, the current steering type D/A converter 300 is provided with a D/A conversion circuit 310, a reference voltage generation circuit 320, a control circuit 340, and a capacity element 390.

The D/A conversion circuit 310 comprises plural current sources 3101 each outputting a predetermined current, and a logic circuit 3102 for selecting required current sources from among the plural current sources 3101. The reference voltage generation circuit 320 outputs a reference voltage VB, and the reference voltage VB determines a current value IOUT to be outputted from a current output terminal DAOUT. The control circuit 340 controls opening/closing of first to third switch elements 331, 332, and 330, according to a power down control signal supplied from a power down control terminal NPD. The capacity element 390 is connected between the reference voltage generation circuit 320 and a fixed potential node 380 which is set at the power supply voltage or ground voltage.

Hereinafter, the operation of the current steering type D/A converter 300 constructed as described above will be described for its normal state and power down state, with reference to FIG. 3 and table 1.

The operation of the current steering type D/A converter 300 of this third embodiment is fundamentally identical to that of the first embodiment.

i) First of all, when a "H" signal is inputted as a power down control signal to the power down control terminal NPD, the current steering type D/A converter 300 operates in the normal state as shown in table 1.

ii) On the other hand, when a "L" signal is inputted as a power down control signal to the power down control terminal NPD, the current steering type D/A converter 300 operates in the power down state as shown in table 1. Hereinafter, the operation will be described more specifically.

i) In order to set the current steering type D/A converter 300 in the normal state, a "H" signal is inputted as a power down control signal to the power down control terminal NPD. At this time, the control circuit 340 sets the first switch element 331 in the ON state, and sets the second and third switch elements 332 and 330 in the OFF states. Then, the reference voltage generation circuit 320 outputs a reference voltage VB from a reference voltage output terminal 320a to the D/A conversion circuit 310 through a wiring 350 and the switch element 331, and the reference voltage VB is supplied to the current sources 3101 through a reference voltage input terminal 310a of the D/A conversion circuit 310. Subsequently, the logic circuit 3102 of the D/A conversion circuit 310 selects at least one current source corresponding to a digital input code supplied from the outside, from among the plural current sources 3101, thereby to select a required current source. The selected current source outputs a current IOUT according to the digital code from the current output terminal DAOUT.

At this time, a low-pass filter is formed by the capacity element 390 and an on-resistance component of the first switch element 331 which is in the ON state. Since the reference voltage potential to which the capacity element 390 is connected has a high impedance, it is easily affected by a sampling clock of the current steering type D/A converter 300 or noise from a digital circuit mounted on the same substrate, leading to a degradation in characteristics of the current steering type D/A converter 300. So, in this third embodiment, the capacity element 390 is provided between the reference voltage potential and the power supply potential or the ground potential to form a low-pass filter, whereby noise is reduced, and the characteristics of the current steering type D/A converter 300 are improved.

ii) On the other hand, in order to set the current steering type D/A converter 300 in the power down state, a "L" signal is inputted as a power down control signal to the power down control terminal NPD. At this time, the control circuit 340 sets the first switch element 331 in the OFF state, and sets the second and third switch elements 332 and 330 in the ON states. That is, according to the power down control signal (L), the control circuit 340 turns off the first switch element 321 to prevent the reference voltage VB outputted from the reference voltage generation circuit 320 from being supplied to the D/A conversion circuit 310, and turns on the second and third switch elements 322 and 330 to supply the voltages at the fixed potential nodes 360 and 370 to the reference voltage generation circuit 320 and the D/A conversion circuit 310, respectively. Thereby, the potential is set at a predetermined fixed potential so that no current flows between the reference voltage generation circuit 320 and the D/A conversion circuit 310, and when this potential is applied to the D/A conversion circuit 310, the reference voltage generation circuit 320 and the current sources 3101 of the D/A conversion circuit 310 halt their operations.

Accordingly, by giving the power down control signal to the control circuit 340, the states of the reference voltage generation circuit 320 and the D/A conversion circuit 310 can be switched between the normal state and the power down state.

Further, as is evident from the fundamental construction described above, even when the current steering type D/A converter 300 is provided with plural D/A conversion circuits corresponding to a single reference voltage generation circuit, these D/A conversion circuits can be power-down-controlled individually. This is realized by constructing the D/A converter such that a single control circuit controls the switch elements to electrically connect or isolate the reference voltage generation circuit and each of the plural D/A conversion circuits, and controls as to whether the reference voltage VB nodes of the reference voltage generation circuit and the D/A conversion circuits are to be set at the fixed potential nodes or not.

As described above, the current steering type D/A converter 300 according to the third embodiment is provided with the control circuit 340 for controlling the switch 331 that electrically connects or isolates the reference voltage generation circuit 320 and the D/A conversion circuit 310, and the switches 330 and 332 for setting the reference voltage VB nodes of the reference voltage generation circuit 320 and the D/A conversion circuit 310 to the fixed potential nodes 360 and 370, respectively. Therefore, a reduction in current consumption of the current steering type D/A converter 300 can be achieved by making an instruction to the control circuit 340. Furthermore, the adverse effect of noise is suppressed by the low-pass filter which is formed when the D/A converter 300 is in the normal state, whereby the characteristics of the current steering type D/A converter 300 are improved.

The respective switch elements 330~332 may be constituted by MOS transistors. In this case, when the MOS transistors are in the ON states, i.e., when the D/A conversion circuit 310 performs the normal operation, the MOS transistors have on-resistance components, and a low-pass filter is formed by the capacity element 390 and the on-resistance components of the MOS transistors. Further, this low-pass filter reduces noise of a high-frequency component such as a sampling clock of the current steering type D/A converter 300.

Furthermore, although the fixed potential nodes 360 and 370 are set to the voltages at which the reference voltage generation circuit 320 and the D/A conversion circuit 310 halt their operations, respectively, the fixed potential nodes 360 and 370 may be set to the same voltage at which both of these circuits 320 and 310 halt the operations.

[Embodiment 4]

According to a fourth embodiment of the present invention, a capacity element is added to a current steering type D/A converter having plural D/A conversion circuits corresponding to a single reference voltage generation circuit as described for the second embodiment.

Figure 4:
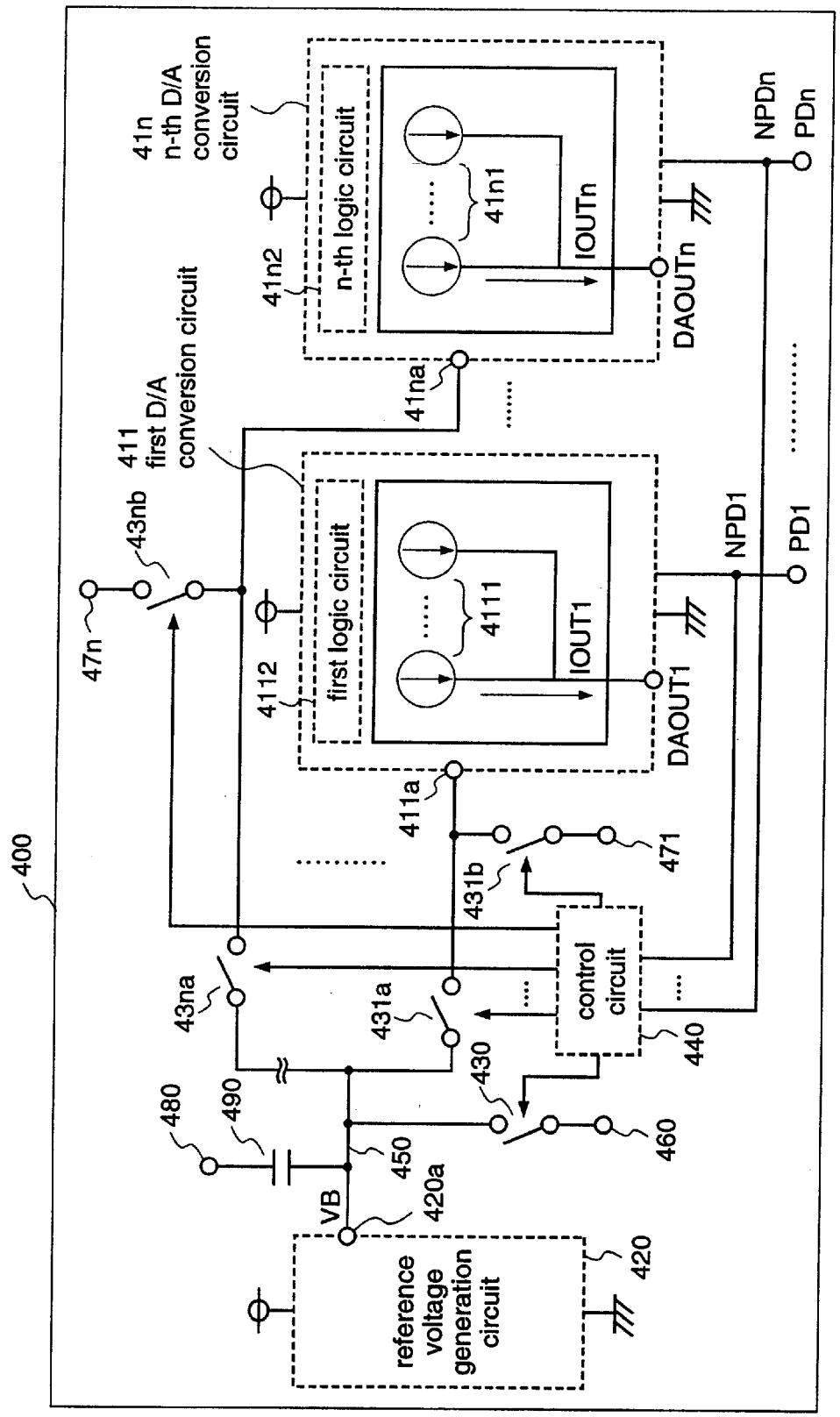
FIG. 4 is a block diagram for explaining the construction of a current steering type D/A converter according to a fourth embodiment of the present invention.
Figure 5:
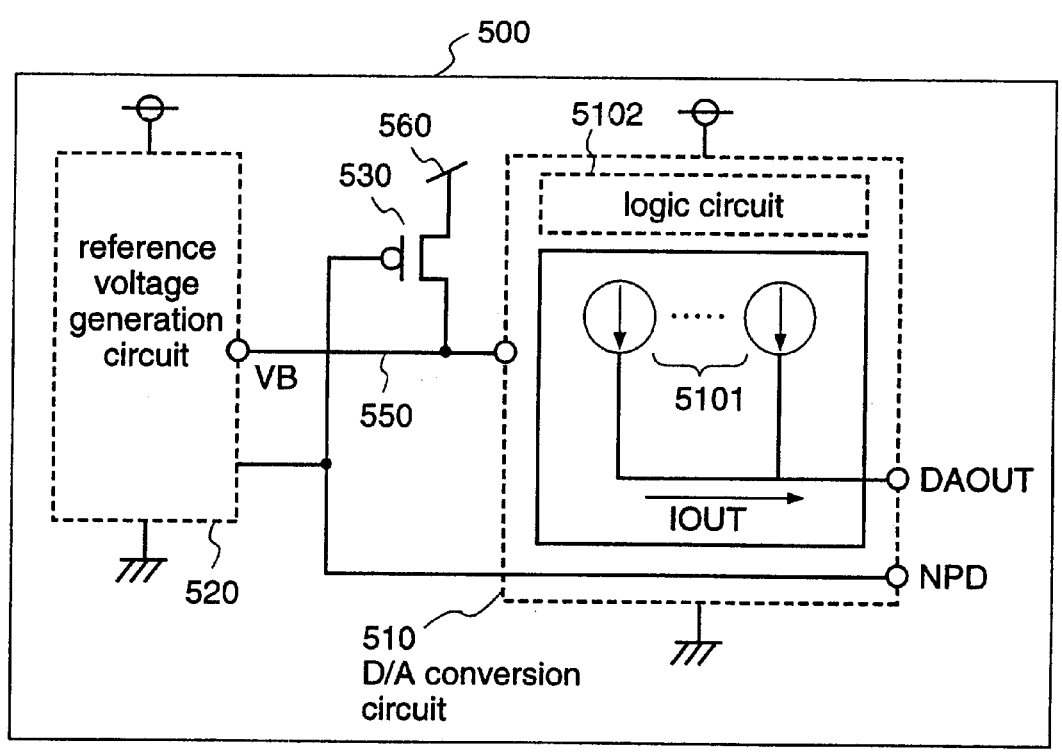
FIG. 5 is a block diagram for explaining the construction of a conventional current steering type D/A converter.
Figure 6:
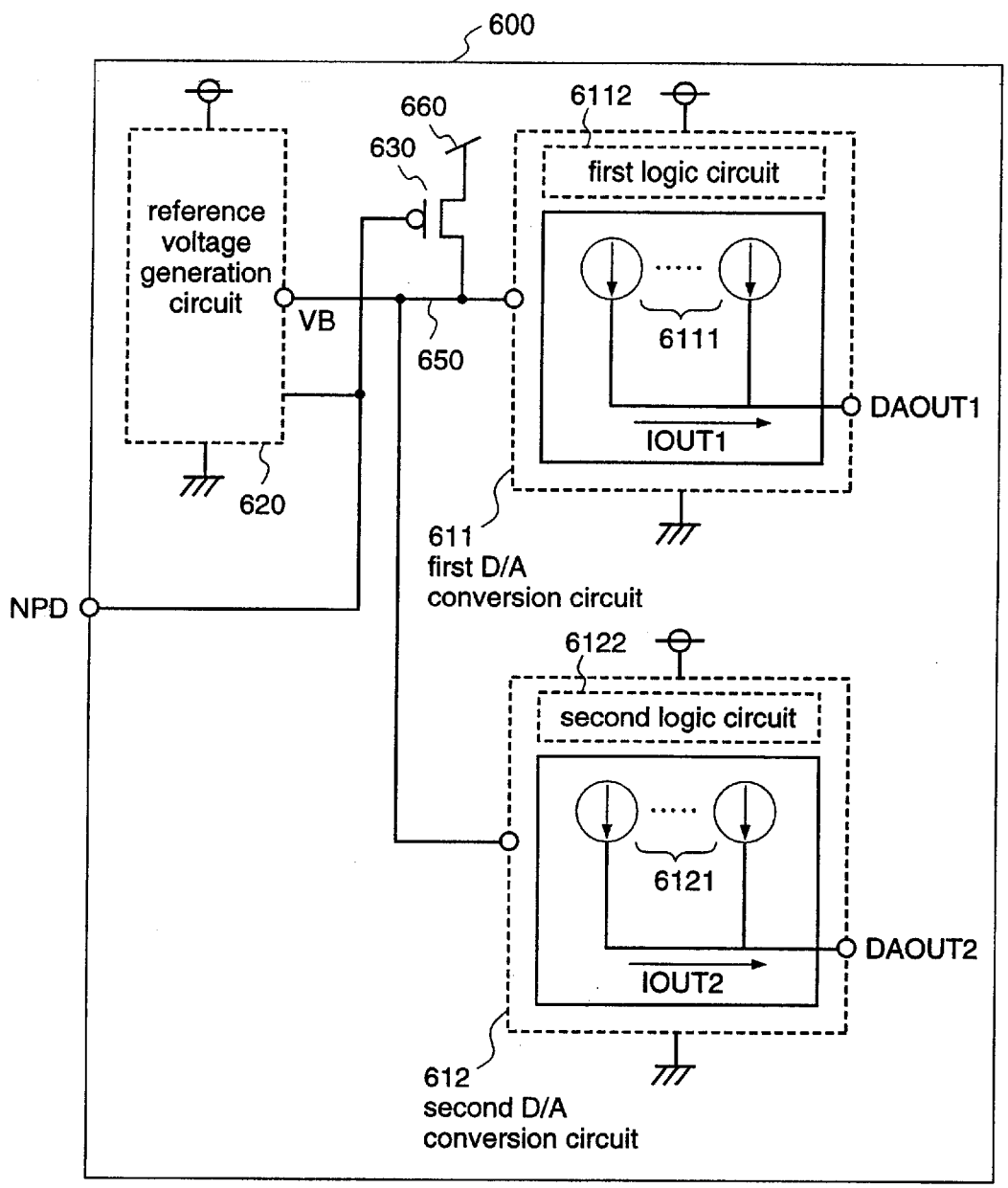
FIG. 6 is a block diagram for explaining the construction of a conventional current steering type D/A converter having plural D/A conversion circuits.

FIG. 4 is a block diagram illustrating the construction of a current steering type D/A converter 400 according to the fourth embodiment of the invention.

With reference to FIG. 4, the current steering type D/A converter 400 comprises first to n-th D/A conversion circuits 411~41n, a reference voltage generation circuit 420, and a control circuit 440.

The first D/A conversion circuit 411 comprises plural current sources 4111 each outputting a predetermined current, and a first logic circuit 4112 for selecting at least one desired current source from among the plural current sources 4111. Likewise, the n-th D/A conversion circuit 41n comprises plural current sources 41n1 each outputting a predetermined current, and an n-th logic circuit 41n2 for selecting at least one desired current source from among the plural current sources 41n1. The second to (n−1)th D/A conversion circuits also have the same construction as described above. The reference voltage generation circuit 420 outputs a reference voltage VB. This reference voltage VB determines a current value IOUT1 to be outputted from a current output terminal DAOUT1 of the first D/A conversion circuit 411, and further, it determines a current value IOUTn to be outputted from a current output terminal DAOUTn of the n-th D/A conversion circuit 41n. The same can be said of the second to (n–1)th D/A conversion circuits. The control circuit 440 controls opening/closing of the first switch element 431*a* for the first circuit, the second switch element 431*b* for the first circuit, . . . , the first switch element 43n*a* for the n-th circuit, the second switch element 43n*b* for the n-th circuit, and the third switch element 430, according to the first to n-th power down control signals which are respectively supplied from the first to n-th power down control terminals NPD1~NPDn.

Hereinafter, the operation of the current steering type D/A converter 400 constituted as described above will be described for its normal state, partially power down state, and completely power down state, with reference to FIG. 4 and tables 2 and 3.

i) Initially, when "H" signals are inputted as the first to n-th power down control signals to the first to n-th power down control terminals NPD1~NPDn, respectively, the current steering type D/A converter 400 operates in the normal state as shown in tables 2 and 3.

ii) On the other hand, when a "L" signal is inputted as a power down control signal to the control terminal corresponding to a required D/A conversion circuit among the first to n-th power down control terminals NPD1~NPDn while "H" signals are inputted as power down control signals to the control terminals corresponding to the remaining D/A conversion circuits, a part of the current steering type D/A converter 400 operates in the power down state, i.e., only the required D/A conversion circuit operates in the power dawn states as shown in tables 2 and 3.

iii) Furthermore, when "L" signals are inputted as the first to n-th power down control signals to the first to n-th power down control terminals NPD1~NPDn, respectively, the current steering type D/A converter 400 operates in the completely power down state, i.e., all of the D/A conversion circuits operate in the power down states as shown in tables 2 and 3.

Hereinafter, the operation will be described more specifically.

i) In order to set the current steering type D/A converter 400 in the normal state, "H" signals are inputted as the first to n-th power down control signals to the first to n-th power down control terminals NPD1~NPDn, respectively. At this time, the control circuit 440 sets the first switch element 431*a* for the first circuit~the first switch element 43n*a* for the n-th circuit in the ON states, and sets the second switch element 43n*b* for the first circuit~the second switch element 43n*b* for the n-th circuit and the third switch element 430 in the OFF states. Then, the reference voltage generation circuit 420 outputs a reference voltage VB from a reference voltage output terminal 420*a* through a wiring 450, and this reference voltage VB is supplied to the current sources 4111~41n1 through a reference voltage input terminal 411*a* of the first D/A conversion circuit 411~a reference voltage input terminal 41n*a* of the n-th D/A conversion circuit 41n. Subsequently, the first to n-th logic circuits 4112~41n2 select current sources corresponding to digital input codes supplied from the outside, from among the plural current sources 4111~41n1, thereby to secure required current sources. The selected current sources output currents IOUT1~IOUTn corresponding to the digital codes, from the current output terminals DAOUT1~DAOUTn.

ii) Next, in order to set the current steering type D/A converter 400 in the partially power down state, a "L" signal is inputted as the first power down control signal to at least one of the first to n-th power down control terminals NPD1~NPDn, for example, the first power down control terminal NPD1, while "H" signals are inputted as the second to n-th power down control signals to the remaining power down control terminals, for example, the second to n-th power down control terminals NPD2(not shown)~NPDn. At this time, the control circuit 440 sets the first switch element 432*a* (not shown) for the second circuit~the first switch element 43n*a* for the n-th circuit, the second switch element 431*b* for the first circuit, and the third switch element 430 in the ON states, and sets the first switch element 431*a* for the first circuit, the second switch element 432*b* (not shown) for the second circuit~the second switch element 43n*b* for the n-th circuit, and the third switch element 430 in the OFF states. Subsequently, the reference voltage generation circuit 420 outputs a reference voltage VB, and this reference voltage VB is supplied to the second to n-th D/A conversion circuits 412(not shown)~41n. Then, the second to n-th logic circuits 4122(not shown)~41n2 select current sources corresponding to digital input codes supplied from the outside, from among the plural current sources 4121(not shown)~41n1, thereby to secure required current sources. The selected current sources output currents IOUT2(not shown)~IOUTn corresponding to the digital codes from the current output terminals DAOUT2(not shown)~DAOUTn, respectively. On the other hand, the reference voltage VB outputted from the reference voltage generation circuit 420 is not supplied to the first D/A conversion circuit 411. That is, according to the first power down control signal (L), the control circuit 440 turns off the first switch element 431*a* for the first circuit to prevent the reference voltage VB outputted from the reference voltage generation circuit 420 from being supplied to the first D/A conversion circuit 411, and supplies the potential at the fixed potential node 471 to the first D/A conversion circuit 411. Thereby, the second switch element 431*b* for the first circuit is turned ON, and the potential is set at a predetermined fixed potential so that no current flows between the reference voltage generation circuit 420 and the first D/A conversion circuit 411. When this potential is applied to the first D/A conversion circuit 411, the current sources 4111 of the first D/A conversion circuit 411 halt their operations. Further, a low-pass filter is formed by the capacity element 490 and an on-resistance component of the first switch element 432*a* for the second circuit which is in the ON state. Since the reference voltage potential to which the capacity element 490 is connected has a high impedance, it is easily affected by a sampling clock of the current steering type D/A converter 400 or noise from a digital circuit mounted on the same substrate, leading to a degradation in characteristics of the current steering type D/A converter 300. So, in this fourth embodiment, the capacity element 490 is connected between the reference voltage potential and the power supply potential or the ground potential to form a low-pass filter, whereby noise is reduced, and the characteristics of the current steering type D/A converter 400 are improved.

iii) Next, in order to set the current steering type D/A converter 400 in the completely power down state, "L" signals are inputted as the first to n-th power down signals to the first to n-th power down control terminals NPD1~NPDn. At this time, the control circuit 440 sets the first switch element 431*a* for the first circuit~the first switch element 43n*a* for the n-th circuit in the OFF states, and sets the second switch element 431*b* for the first circuit~the second switch element 43n*b* for the n-th circuit and the third switch element 430 in the ON states. That is, the reference voltage outputted from the reference voltage generation circuit 420 is not supplied to the first to n-th D/A conversion circuits 411~41n. When all of the first to n-th D/A conversion circuits 411~41n are set in the power down states, the reference voltage generation circuit 420 becomes unnecessary and, therefore, the voltages at the fixed potential nodes 460 and 471~47n are supplied to the reference voltage output terminal 420a of the reference voltage generation circuit 420 and the reference voltage input terminals 411a~41na of the first to n-th D/A conversion circuits 411~41n, respectively, according to the "L" signals inputted to the control circuit 440, thereby to fix the potentials so that all of these circuits halt their operations.

As described above, according to the fourth embodiment, the current steering type D/A converter 400 is provided with the plural D/A conversion circuits 411~41n, the switch elements 430 and 431~43n corresponding to the respective conversion circuits, and the control circuit 440 for controlling the switch elements 430 and 431~43n to set the reference voltage generation circuit 420 and the respective D/A conversion circuits 411~41n in the ON or OFF states. Therefore, the respective D/A conversion circuits 411~41n can be power-down-controlled individually, whereby current consumption of the current steering type D/A converter 400 is reduced. Furthermore, the adverse effect of noise is suppressed by the low-pass filter which is formed when at least one of the D/A conversion circuits is in the normal state, whereby the characteristics of the current steering type D/A converter 400 are improved.

While in this fourth embodiment power down of only one D/A conversion circuit is described as an example of partial power down of the plural D/A conversion circuits, the number of D/A conversion circuits to be power downed is not restricted to one. That is, two or more D/A conversion circuits may be power downed, and this is achieved by inputting "L" signals as the power down control signals to the power down control terminals corresponding to the required D/A conversion circuits.

Furthermore, the respective switch elements 430, 431a, 431b, . . . , 43na, 43nb may be constituted by MOS transistors. In this case, when the MOS transistors are in the ON states, i.e., when the D/A conversion circuits 411~41n are performing the normal operations, the MOS transistors have on-resistance components, and a low-pass filter is formed by the capacity element 490 and the on-resistance components of the MOS transistors. Further, this low-pass filter can reduce noise of a high-frequency component such as a sampling clock of the current steering type D/A converter 400.

Furthermore, although the fixed potential nodes 460, 471~47n are set to the voltages at which the reference voltage generation circuit 420 and the D/A conversion circuits 411~41n halt the operations, respectively, these potential nodes may be set to the same voltage at which all of these circuits 420, 411~41n halt their operations.

What is claimed is:

1. A current steering type D/A converter comprising:
   a D/A conversion circuit for performing D/A conversion, comprising plural current sources each outputting a predetermined current, and a logic circuit for selecting desired current sources from among the plural current sources;
   a reference voltage generation circuit for generating a reference voltage potential which determines an output current value of the D/A conversion circuit;
   a first switch element having an ON state, an OFF state, an end connected to a reference voltage output terminal of the reference voltage generation circuit, and another end connected to a reference voltage input terminal of the D/A conversion circuit;
   a second switch element having an ON state, an OFF state, an end connected to a first fixed potential for fixing the reference voltage potential at a predetermined potential that prevents current from flowing in the D/A conversion circuit, and another end connected to a first node which connects the end of the first switch element and the reference voltage output terminal of the reference voltage generation circuit;
   a third switch element having an ON state, an OFF state, an end connected to a second fixed potential and a second end connected to the reference voltage generation circuit; and
   a control circuit for
      controlling the switch elements for setting the first switch element into the ON state, and each of the second and third switch elements into the OFF state, when the D/A conversion circuit is to be operated in a normal state, and
      controlling the switch elements so as to set the first switch element into the OFF state, and each of the second and third switch elements into the ON state, when the D/A conversion circuit is operated in a power down state.

2. The current steering type D/A converter according to claim 1, comprising:
   n pieces of the D/A conversion circuits (n: integer at least 2);
   the first switch element and the second switch element corresponding each of the n pieces of D/A conversion circuits; and
   instead of the above-mentioned control circuit, a control circuit for
      controlling the switch elements for setting the third switch element into the ON state, each of the n pieces of first switch elements into the OFF state, and each of the n pieces of second switch elements into the ON state, when each of all of the n pieces of D/A conversion circuits are operated in a normal state,
      controlling the switch elements for setting the third switch element into the ON state, each of the n pieces of first switch elements into the OFF state, and each of the n pieces of second switch elements into the ON state, when each of all of the n pieces of D/A conversion circuits are operated in a power down state, and
      controlling the switch elements such that, when at least one of the n pieces of D/A conversion circuits is operated in a power down state while the remaining circuits are operated in normal states, the third switch element is set into the OFF state, the first switch element and the second switch element of the D/A conversion circuit for power-down-operation are set into the OFF state and the ON state, respectively, and the first switch elements and the second switch elements of the remaining circuits for operation in the normal states are set into the ON states and the OFF states, respectively.

3. The current steering type D/A converter according to claim 1, further comprising a capacity element connected between the second node connecting the reference voltage output terminal of the reference voltage generation circuit with the end of the third switch element, and a power supply potential or ground potential.

4. The current steering type D/A converter as according to claim 2, further comprising a capacity element connected between the second node connecting the reference voltage output terminal of the reference voltage generation circuit with the end of the third switch element, and a power supply potential or ground potential.

5. A current steering type D/A converter comprising:

a D/A conversion circuit for performing D/A coversion, comprising plural current sources each outputting a predetermined current, and a logic circuit for selecting desired current sources from among the plural current sources;

a reference voltage generation circuit for generating a reference voltage potential which determines an output current value of the D/A conversion circuit;

a first switch element having an ON state and an OFF state, an end connected to a reference voltage output terminal of the reference voltage generation circuit, and another end connected to a reference voltage input terminal of the D/A conversion circuit;

a second switch element having an ON state and an OFF state, an end connected to a first fixed potential for fixing the reference voltage potential at a predetermined potential that prevents current from flowing in the D/A conversion circuit, and another end connected to a node which connects the end of the first switch element and the reference voltage output terminal of the reference voltage generation circuit; and a control circuit for
controlling the switch elements for setting the first switch element into the ON state, and each of the second and third switch elements into the OFF state, when the D/A conversion circuit is operated in the normal state, and controlling the switch elements for setting the first switch element into the OFF state, and each of the second and third switch elements into the ON state, when the D/A conversion circuit is operated in a power down state.

6. A D/A converter comprising:

a D/A conversion circuit;

a reference voltage generation circuit;

a first switch element having an end connected to the reference voltage generation circuit for generating a reference voltage input and another end connected to the D/A conversion circuit, the first switch element for reducing to zero the reference voltage input in a power down state; and a second switch element for adjusting a potential at the reference voltage input terminal to a fixed potential in the power down state.

* * * * *